(12) United States Patent
Kyooka et al.

(10) Patent No.: US 10,514,245 B2
(45) Date of Patent: Dec. 24, 2019

(54) GAP SENSOR AND GAP MEASURING METHOD USING A CAPACITANCE MEASURING TECHNIQUE DETECTING OR MEASURING GAPS BETWEEN CONDUCTIVE MEMBER SURFACES

(71) Applicant: KYOOKA Co., Ltd., Tokyo (JP)

(72) Inventors: Yoshiteru Kyooka, Tokyo (JP); Masato Abe, Yamagata (JP)

(73) Assignee: KYOOKA CO., LTD., Tokyo (JP)

( * ) Notice: Subject to any disclaimer, the term of this patent is extended or adjusted under 35 U.S.C. 154(b) by 110 days.

(21) Appl. No.: 15/738,299

(22) PCT Filed: Jul. 21, 2017

(86) PCT No.: PCT/JP2017/026528
§ 371 (c)(1),
(2) Date: Dec. 20, 2017

(87) PCT Pub. No.: WO2018/216232
PCT Pub. Date: Nov. 29, 2018

(65) Prior Publication Data
US 2018/0340766 A1    Nov. 29, 2018

(30) Foreign Application Priority Data

May 26, 2017    (JP) .................................. 2017-104083

(51) Int. Cl.
*G01B 7/14*    (2006.01)
*H05K 1/02*    (2006.01)
(Continued)

(52) U.S. Cl.
CPC ............... *G01B 7/14* (2013.01); *G01B 7/023* (2013.01); *H05K 1/028* (2013.01); *H05K 1/162* (2013.01);
(Continued)

(58) Field of Classification Search
USPC ......................................................... 324/662
See application file for complete search history.

(56) References Cited

U.S. PATENT DOCUMENTS 5,070,302 A    12/1991    Marcus et al.
6,828,806 B1    12/2004    Hirota et al.
(Continued)

FOREIGN PATENT DOCUMENTS

CN    101493310 A    7/2009
EP    0441479 A2    8/1991
(Continued)

OTHER PUBLICATIONS

International Search Report (ISR) and Written Opinion of the International Searching Authority in International Patent Application No. PCT/JP2017/026528, dated Oct. 24, 2017.
Feb. 25, 2019 Extended European Search Report in European Application No. 17811429.4.

*Primary Examiner* — Jay Patidar
(74) *Attorney, Agent, or Firm* — Greenblum & Bernstein, P.L.C.

(57) ABSTRACT

A probe is a three-layer substrate having two faces on which paired electrodes are formed at corresponding positions and guard patterns are formed around the electrodes. The guard patterns and all electrodes are driven by a common probe signal to an equal potential, thereby commonly guarding the electrodes. Based on a clamp current of each electrode, a capacitance is found to obtain gap data.

14 Claims, 8 Drawing Sheets

(51) Int. Cl.
*H05K 1/16* (2006.01)
*G01B 7/02* (2006.01)
*B64F 5/10* (2017.01)

(52) U.S. Cl.
CPC ...... *B64F 5/10* (2017.01); *H05K 2201/10151* (2013.01)

(56) References Cited

U.S. PATENT DOCUMENTS

| | | |
|---|---|---|
| 7,756,662 B2 | 7/2010 | Tokita |
| 8,054,089 B2 | 11/2011 | Hauer et al. |
| 8,513,959 B2 | 8/2013 | De Boer et al. |
| 8,570,055 B2 | 10/2013 | De Boer et al. |
| 8,638,109 B2 | 1/2014 | De Boer et al. |
| 8,841,920 B2 | 9/2014 | De Boer et al. |
| 2005/0270041 A1* | 12/2005 | Lieder .................. G01B 7/023 324/663 |
| 2015/0145535 A1 | 5/2015 | Nys et al. |

FOREIGN PATENT DOCUMENTS

| | | | |
|---|---|---|---|
| GB | 2243220 A | 10/1991 | |
| JP | 2007-225443 A | 9/2007 | |
| JP | 2009-069035 A | 4/2009 | |
| JP | 4832512 B2 | 12/2011 | |
| JP | 2015-079979 A | 4/2015 | |
| WO | 2011/080308 A1 | 7/2011 | |
| WO | 2014/095553 A1 | 6/2014 | |

* cited by examiner

RELATED ART

GAP SENSOR AND GAP MEASURING METHOD USING A CAPACITANCE MEASURING TECHNIQUE DETECTING OR MEASURING GAPS BETWEEN CONDUCTIVE MEMBER SURFACES

TECHNICAL FIELD

The present invention relates to a gap sensor for and a gap measuring method of detecting a gap, in particular, surface-distributed gaps between the surfaces of members that face each other.

BACKGROUND ART

In technology of assembling ships, aircraft, and the like, attaching an external panel to an internal part requires an alignment of relative positions. For example, a main wing of an aircraft has a box structure including beams and ribs. A base end part of the main wing has a frame structure to be joined with a fuselage. The fuselage has a fixing part (bracket) substantially having a cylindrical structure to receive the base end part of the main wing. The base end part of the main wing is inserted into the fixing part and joined to the same to form a tea-caddy-like structure. The fixing part of the fuselage is constructed to have two plate members that hold therebetween a plate member constituting the base end part of the main wing. The surface of the plate member of the base end part faces the plate members of the fixing part with a gap of about several millimeters between them. Each of the plate members is made of conductive material such as aluminum alloy and carbon fiber. In the joining work of the fuselage and main wing, they are aligned and adjusted to each other to establish a predetermined positional relationship. Thereafter, a spacer adjusted to the shape of the gap is inserted into the gap and is joined to the adjoining members. The same is carried out when manufacturing a fuselage by separately preparing a front fuselage, a middle fuselage, and a rear fuselage and joining them together into one body. Related arts are, for example, Japanese Patent Publication NO. 4832512 and Japanese Unexamined Patent Application Publication No. 2015-79979.

SUMMARY OF INVENTION

Problems to be Solved by Invention

After aligned to each other, the plate member of the base end part of the main wing and the plate members of the fixing part of the fuselage define gaps at joined positions. The gaps are multipoint-measured with a gap sensor (a feeler gauge, a thickness gauge) to obtain three-dimensional data on the shape of a gap space to determine the shape of the spacer.

An electronic gap sensor employing a capacitance sensor includes a probe that generally has an elongated structure and arranges, on its front end side, flat detecting electrodes. When the electrodes are arranged on each face of the probe, each face of each electrode layer must be covered with a guard pattern. Namely, six conductive layers in total must be prepared. This restricts the thinning of the probe. In recent years, press die processing of sheet material for ships, aircraft, cars, and the like requires a three-dimensional measurement of gaps to adjust a gap (clearance) between a die and a punch. There is, therefore, a requirement for measuring smaller gaps.

Only after the main wing and fuselage are joined together, wheels become installable on them, and therefore, the gap measurement must speedily and correctly be carried out to make the fuselage and main wing movable with the wheels. The same problem exists in the press die processing of sheet material for ships, aircraft, cars, and the like because adjusting a gap (clearance) between a die and a punch requires a three-dimensional measurement of gaps.

Generally, the electronic gap sensor employing a capacitance sensor applies a predetermined signal such as a rectangular wave to electrodes and actively guards guard patterns with an electrode voltage through a buffer circuit. An example of a probe illustrated in FIG. 1(a) includes detecting electrodes De' to which a probe signal is applied and guard patterns G1 and G2 that set the potential of the periphery and back face of each electrode equal to an electrode potential. The probe signal is applied to electrode patterns E1 and E2 containing the electrodes De' and currents corresponding to capacitances of measuring objects are detected. A detected potential of each electrode De' is used to actively guard the corresponding guard pattern G1 or G2 through the buffer, to make the potential of the peripheries of the electrode equal to the electrode potential. This active guard suppresses electric fields other than electric fields created between the electrodes and the measuring objects, thereby improving the accuracy of a capacitance measurement.

Figure 1A:
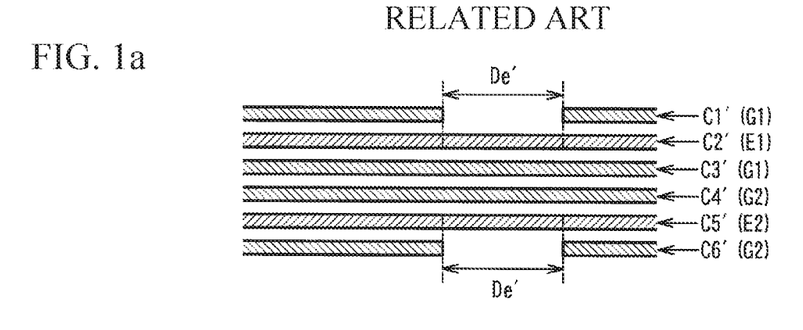
FIG. 1(a) is a schematic view illustrating conductive layers in an electrode part according to a related art and FIG. 1(b) is a schematic view illustrating conductive layers in an electrode part according to the present invention.

Since the potential of the measuring electrode De' is set as a guard potential for the guard pattern G1 or G2, it is impossible to simultaneously measure a plurality of electrodes surrounded by the same guard patterns. This is because electrode signals differ from one another, and therefore, corresponding guard signals differ from one another depending on electrodes.

Means to Solve Problems

In consideration of the above-mentioned problems, the present invention provides an electronic gap sensor for and a gap measuring method of obtaining gap data that involves minimized measurement errors and improved reproducibility.

According to a technical aspect of the present invention, the gap sensor for detecting, based on a capacitance measuring technique, gaps between a surface of a conductive first member and a surface of a conductive second member that faces the first member includes a probe extending in the direction of a main axis and a main body. The probe has a base end part connected to the main body and a front end side provided with a plurality of electrodes. The probe has a multilayer substrate structure in which a first conductive layer, a second conductive layer, and a third conductive layer are laminated one on another. The first conductive layer defines a first face of the probe and forms an arrayed first electrode group and a first guard layer electrically disconnected from the first electrode group. The third conductive layer defines a second face of the probe and forms an arrayed second electrode group at a position corresponding to the first electrode group and a second guard layer electrically disconnected from the second electrode group. The second conductive layer is arranged between the first conductive layer and the third conductive layer and forms a guard electrode at a position corresponding to the first and second electrode groups and signal line patterns electrically disconnected from the guard electrode, the signal line patterns being electrically connected to electrodes of the first and second electrode groups, respectively. The main body includes a control unit that applies a probe signal to the first guard layer, guard electrode, and second guard layer, voltage-clamps, by the probe signal through the signal line patterns, the electrodes of the first and second electrode groups, and detects clamp currents due to the voltage clamp, thereby measuring gaps at the positions of the electrodes.

According to another technical aspect of the present invention, the gap measuring method of measuring, based on a capacitance measuring technique, gaps between a surface of a conductive first member and a surface of a conductive second member that faces the first member with the use of a prove having two faces on which a plurality of electrode pairs and guard layers are formed at corresponding positions includes generating a probe signal, applying the probe signal to the guard layers, separately voltage-clamp electrodes of the plurality of electrode pairs by the probe signal, measuring clamp currents of the electrodes and thereby measuring capacitances at respective positions of the electrodes, and according to the capacitances, measuring gaps at the respective electrode positions.

MODE OF IMPLEMENTING INVENTION

Embodiments of the present invention will be explained with reference to the drawings.

Figure 1B:
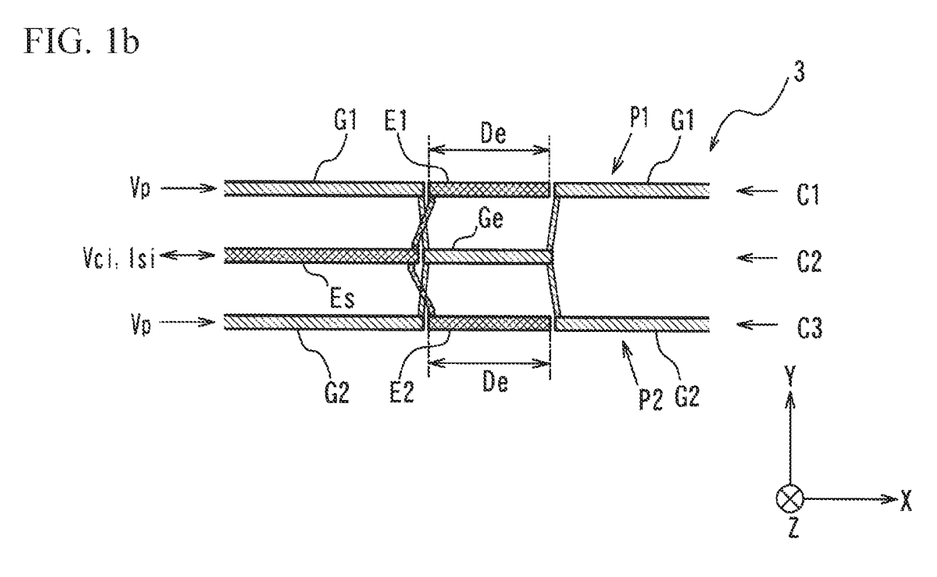
Figure 2:
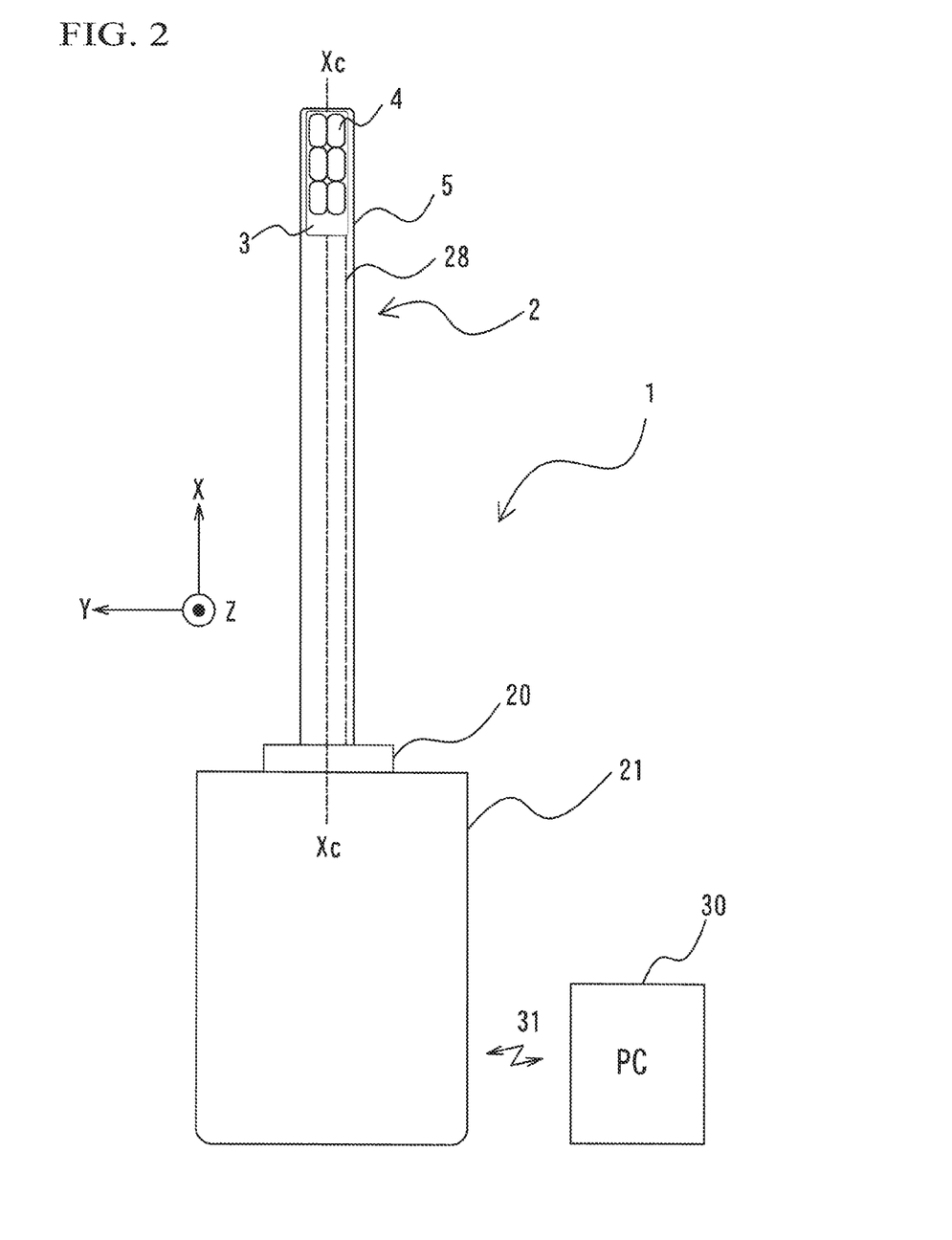
FIG. 2 is a top view illustrating a gap sensor according to an embodiment of the present invention.

FIG. 2 is a top view illustrating a gap sensor according to an embodiment of the present invention. The gap sensor 1 has a probe 2 on which electrodes to detect gaps are arranged and a main body 21 that is connected through a connector 20 serving as a probe support to the probe 2. The main body 21 includes a control part 10 that applies a voltage to the detecting electrodes of the probe 2 and measures displacement currents. The probe 2 has an elongated shape extending in the direction of a main axis (Xc) in an XY-plane and is inserted into a gap space G to measure gaps, the gap space G being formed between opposing surfaces S1 and S2 of conductive members such as works. The probe 2 has a flexible printed board 5 provided with an electrode part 3 that includes an array of electrode pairs 4. The flexible printed board (FPB) 5 in FIG. 1 has an elongated shape extending in the main axis direction X and a three-layer structure. The FPB 5 applies a predetermined potential between the electrodes 4 and the surfaces S1 and S2 of the conductive members to be measured, measures response currents, and according to obtained capacitances, finds gaps at the positions of the electrodes. The surfaces of the probe 2 including the electrode part 3 are covered with a filler film to be attracted by a magnet.

<Probe Electrode>

Figure 3:
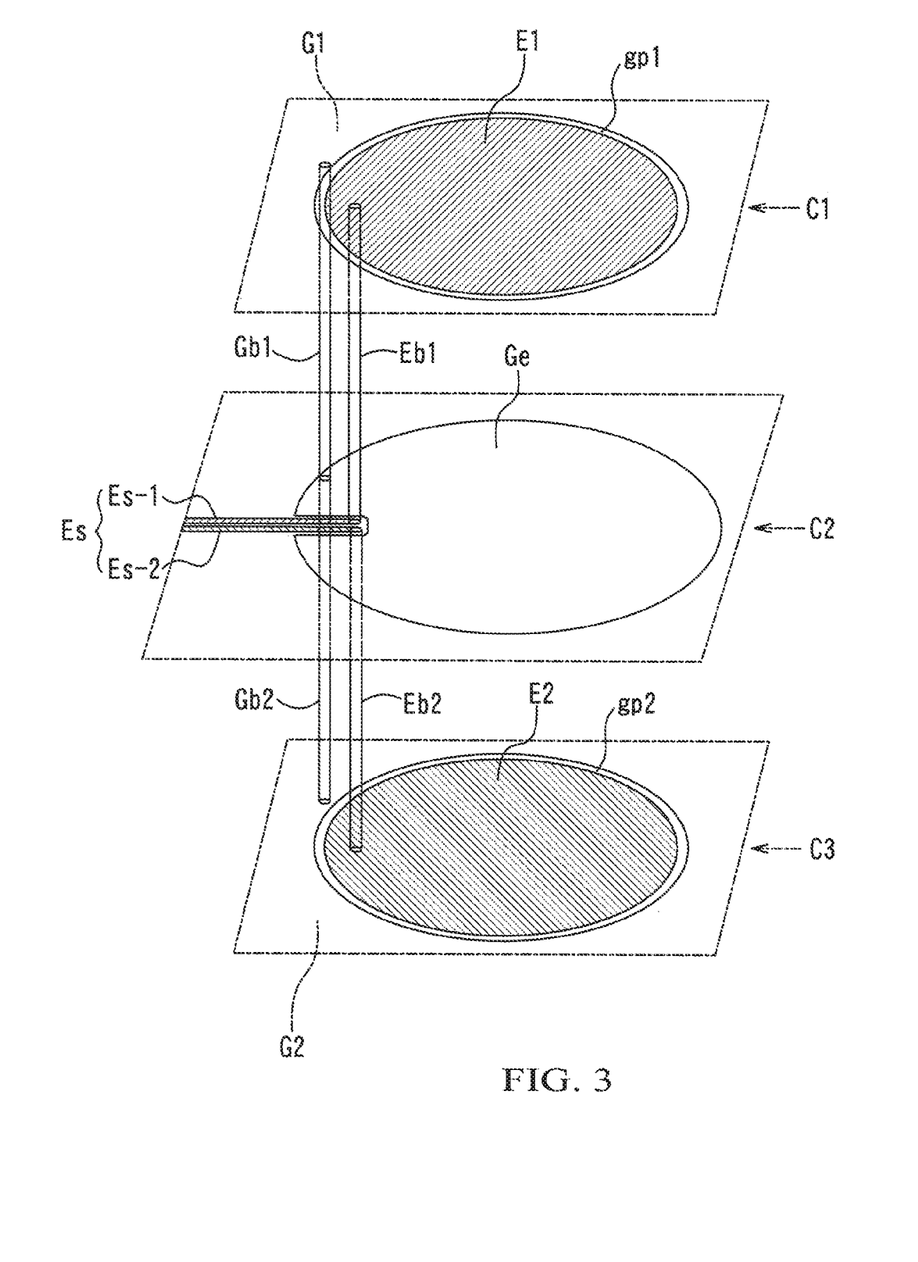
FIG. 3 is a schematic view illustrating a sectioned structure of an electrode part of a probe according to the embodiment.

Structures of conductive faces in the electrode part 3 of the probe 2 are schematically illustrated in FIGS. 1(b) and 3. The flexible printed board (FPB) 5 has a guard pattern G1 (a first conductive layer C1) that defines a top face (a first face) P1, a guard pattern G2 (a third conductive layer C3) that defines a bottom face (a second face) P2, and a signal pattern Es (a second conductive layer C2) that is held between the two guard patterns. The signal pattern Es is an aggregate of electrode signal patterns Esi that are electrically separately connected to electrodes Ei. Among the conductive layers, insulation layers (not illustrated) are arranged. In FIG. 1(b), the electrodes Ei are illustrated circular for convenience. They may have an optional shape such as oval and ellipse.

Referring to FIG. 3, the electrode part 3 includes an electrode pattern E1 that is formed in the first conductive layer C1 and is surrounded by the guard pattern G1. Between the electrode pattern E1 and the guard pattern G1, an annular gap gp1 is formed to serve as an insulator, and therefore, the electrode pattern E1 and guard pattern G1 are not electrically connected to each other. An electrode pattern E2 is formed in the third conductive layer C3 and is surrounded by the guard pattern G2. Between the electrode pattern E2 and the guard pattern G2, an annular gap gp2 is formed, and therefore, the electrode pattern E2 and guard pattern G2 are not electrically connected to each other. The electrode patterns E1 and E2 are formed at the same position in the XY-plane and constitute an electrode pair.

In the second conductive layer C2, a guard pattern Ge is formed at a position corresponding to the electrode pair and is electrically connected through via holes Gb1 and Gb2 to the guard patterns G1 and G2, respectively. On the other hand, the electrode pattern E1 is connected through a via hole Eb1 to a corresponding signal pattern Es1 of the second conductive layer C2 and the electrode pattern E2 is connected through a via hole Eb2 to a corresponding signal pattern Es2. In the second conductive layer C2, gaps are formed between the via holes Eb1 and Eb2 and the guard pattern Ge. A plurality of electrode pairs are formed in the electrode part 3 and the electrodes Ei are connected through the signal patterns Esi to corresponding voltage clamp amplifiers VCAi, respectively.

The guard patterns G1, Ge, and G2 are common to all electrodes (Ei: i=1, 2, . . . , n) (n being the number of the electrodes 4). Accordingly, as will be explained later, all of the electrodes Ei are separately and independently voltage-clamped by the same probe signal Vp, and at the same time, the guard patterns G1, Ge, and G2 are driven by the probe signal Vp, so that all electrodes are always at the same potential. All of the electrodes Ei and guard patterns are electrically independent of one another, and therefore, are in a virtual short-circuited state but not actually short-circuited. Due to this, the three-layer structure is able to precisely measure capacitances. The electrodes Ei are separately voltage-clamped, and therefore, it is possible to simultaneously measure their clamp currents and simultaneously obtain capacitances. The embodiment illustrated in FIG. 2 will be explained on an assumption that it has six electrode pairs, i.e., the number of electrodes is twelve (n=12).

<Equipotential Drive Control>

Figure 4:
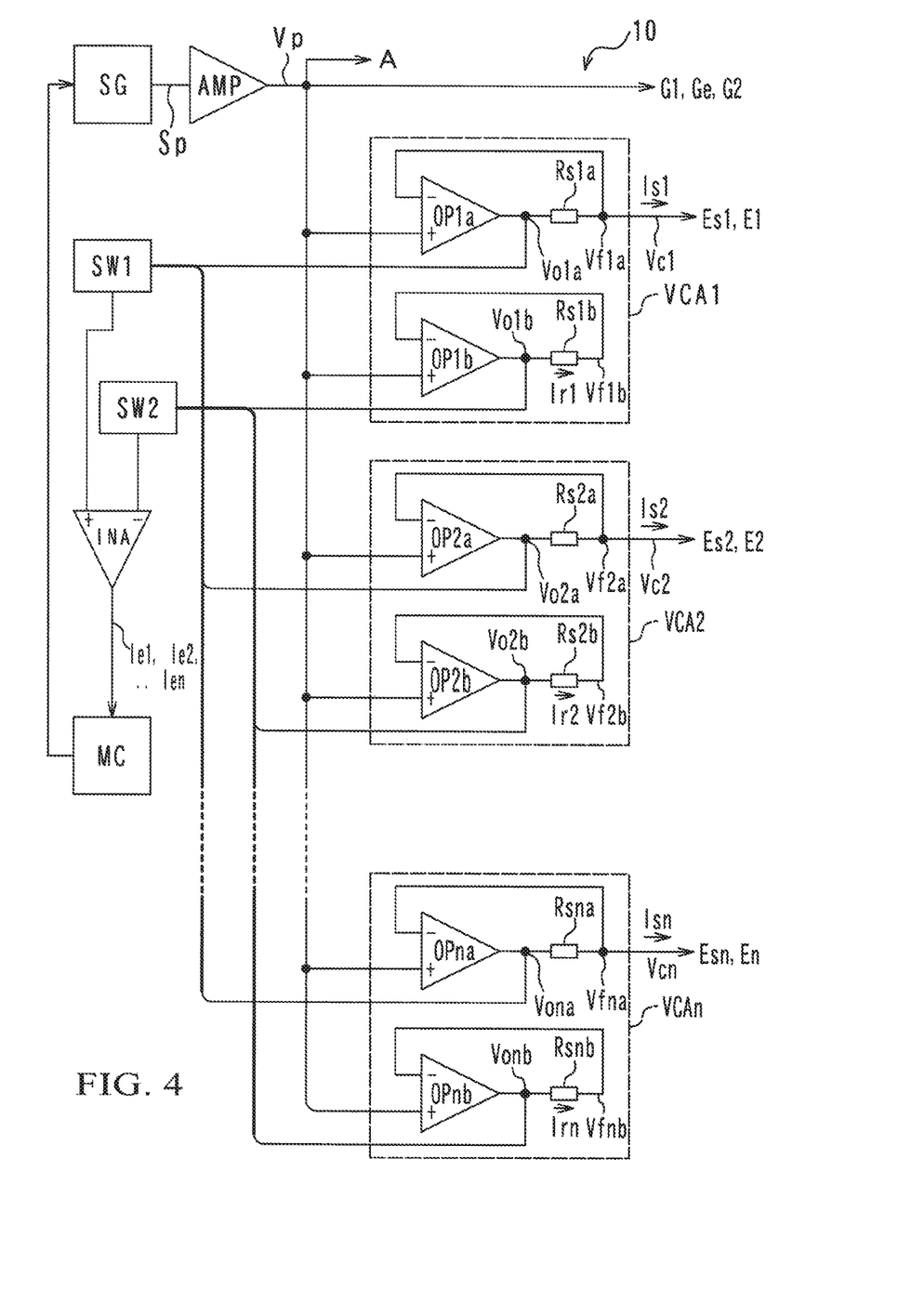
FIG. 4 is a schematic view illustrating a control circuit of a control unit.

FIG. 4 is a schematic view illustrating a control circuit of the control unit 10. Controlling guard potential and electrodes according to the present invention uses an original equipotential driving technique. A probe signal generator SG generates a sinusoidal wave as a reference probe signal Sp. The amplitude thereof is controlled by a microcontroller MC. The probe signal Sp is transmitted through a driver AMP and is applied as a guard signal Vp to the guard patterns G1, Ge, and G2.

The voltage clamp amplifiers (voltage clamp circuits) VCA1 to VCA12 are connected through the signal patterns Es1 to Es12 to the 12 electrodes E1 to E12, respectively. Each voltage clamp amplifier VCAi receives the output Vp of the driver AMP as a probe voltage to voltage-clamp the electrode Ei at the voltage Vp. The probe voltage Vp is a sinusoidal wave, and therefore, the voltage clamp amplifier VCAi is a variable voltage source.

The voltage clamp amplifier VCAi includes a main clamp amplifier OPia, i.e., a differential amplifier (operational amplifier). When receiving the probe voltage Vp at a non-inverting input terminal (+), the main clamp amplifier OPia conducts negative feedback control to always equalize a clamp output voltage Vfia connected to an inverting input terminal (−) with the probe voltage Vp. Between an output terminal of the main clamp amplifier OPia and the inverting input terminal thereof, a resistor (clamp current detecting resistor) Rsia is connected to detect a clamp current Isi. A terminal voltage of the resistor Rsia is able to provide a clamp current (displacement current) at the time of voltage-clamping of the electrode Ei.

The terminal voltage $\Delta V$ of the resistor Rsia is detected through selector switches SW1 and SW2 and is amplified by a differential amplifier INA to provide the clamp current Iei=$\Delta V$/Rsia.

The main clamp amplifier OPia is a differential amplifier that slightly involves an input capacitance, a bias current, and the like, as well as temperature characteristics and characteristic variations. The capacitance of a measuring object is generally about pF or lower, and therefore, the characteristic variations of the differential amplifier may cause large measurement errors. To deal with this, a differential amplifier of equal characteristics is employed as a reference clamp amplifier OPib to compensate for error elements other than the probe current.

More precisely, the voltage clamp amplifier VCAi has, in addition to the main clamp amplifier OPia, the reference clamp amplifier OPib. The reference clamp amplifier OPib has an external circuit that is the same as that of the main clamp amplifier OPia. Receiving the prove voltage Vp at a non-inverting input terminal (+), the reference clamp amplifier OPib conducts negative feedback control to always equalize a clamp output voltage VFib with the probe voltage Vp. The clamp output voltage Vfib has no load element because it is not connected to the electrode Ei. This is the only difference from the main clamp amplifier OPia.

Between an output terminal of the reference clamp amplifier OPib and an inverting input terminal thereof, a resistor (reference current detecting resistor) Rsib is connected to detect a clamp current Iri for no load condition. A terminal voltage of the resistor Rsib is able to provide a reference clamp current Iri at the time of voltage clamping under no load condition. The reference clamp current Iri reflects current components other than a current passing through load, i.e., the electrode. On the other hand, clamp output voltages Vfia and Vfib of the two operational amplifiers are substantially equal to the probe voltage Vp at the time of voltage clamping. Accordingly, a probe voltage Voia detected by the main clamp amplifier OPia is understood to involve the bias current Iri relating to the differential amplifier in addition to the net clamp current Isi. Accordingly, a differential computation between the output voltages Voia and Voib of the main and reference clamp amplifiers OPia and OPib is able to provide a net clamp current Iei.

The two differential amplifiers OPia and OPib that form the voltage clamp amplifier VCAi are preferably operational amplifiers having equal characteristics and packed in one package to form a dual-type operational amplifier. To protect inputs to the differential amplifiers, a resistor may be inserted between each non-inverting input terminal and each of the clamp output terminals Vfia and Vfib.

According to the embodiment of FIG. 4, the microcontroller MC controls the selector switches (analog switches) SW1 and SW2 to sequentially select a measuring one from the electrodes Ei, and the differential amplifier (instrumented amplifier) INA carries out a differential computation between the output voltages Voia and Voib, thereby precisely detecting a clamp current to serve as a current detecting circuit.

The present invention employs the equipotential driving technique to separately drive electric elements by the same potential, and therefore, is capable of, in principle, simultaneously measuring clamp currents of a plurality of electrodes. The present embodiment combines one differential amplifier INA with selector switches to measure electrode capacitances in time division. Employing one processing system commonly for all electrodes may realize stabilized processing and compactness of the main body 21. According to the present embodiment, the probe 2 has twelve electrodes in six pairs. It is possible to employ a larger number of electrodes.

<Feedback Control of Adaptive Probe Signal and Charge Clamp Technique>

The electrode Ei is a flat electrode and forms a virtual capacitor (capacitance C) with respect to an opposing surface to be measured. By measuring the capacitance, a distance d between the electrode and the surface can be found as will be explained later.

When a potential difference v occurs between the electrode Ei and the conductive surface S1 or S2, the surface causes a charge q=±Cv. If the potential difference is of an alternating current, a displacement current i=C$\delta$v/$\delta$t passes through the electrode. The conductive surface in the same area as the electrode shows a charge of the opposite polarity, and therefore, there is a relationship of C=$\epsilon$S/d where d is the distance between the electrode and the conductive surface and $\epsilon$ is a permittivity of a gap space. Accordingly, measuring the displacement current and finding therefrom the capacitance of the virtual capacitor results in obtaining the distance d=$\epsilon$S/C. According to the present embodiment, the potential difference v is controlled by voltage clamp as mentioned above so that it correctly agrees with the probe signal Vp which is expressed as Vp(t)=A sin(2$\pi$ft).

The amplitude of a clamp current created by an applied probe signal becomes smaller as the capacitance C of a measuring object becomes smaller, to lower a detection accuracy. To deal with this, the present embodiment maintains the amplitude of a clamp current at around a predetermined level by making the microcontroller MC adaptively control the amplitude A of a probe signal, thereby improving the measurement accuracy. Keeping the amplitude of a current constant corresponds to keeping an accumulated charge as an integral value of displacement current constant irrespective of variations in the capacitor capacitance. More precisely, if the amplitude of a clamp current becomes smaller, the microcontroller MC increases the amplitude of the probe signal Vp serving as a common potential for the equipotential driving, and if the amplitude of the clamp current becomes larger, decreases the amplitude of the probe signal Vp.

It is more preferable to feedback-control the probe signal voltage Vp in such a way as to keep constant the amplitude of a clamp current that is proportional to a voltage amplitude coefficient A, so that a capacitance is obtained from an amplitude A of the adaptive probe signal Vp. This is to feedback-control the magnitude of the probe signal Vp in such a way as to charge the virtual capacitor constituted by the measuring object and electrode to a predetermined value. This is an original charge clamp technique of the present invention based on the electrode voltage clamp control and equipotential driving control.

According to the charge clamp technique of the present invention, when the probe signal voltage Vp has an amplitude A0 with respect to a known corrected reference capacitance C0 and when the adaptive probe signal voltage Vp has an amplitude A with respect to an optional capacitance C, there is established a relationship of $C/C0=A/A0$. Information about the amplitude A is directly obtainable by rectifying and smoothing (integrating) the probe signal Vp. Accordingly, only by measuring the amplitude A of the adaptive probe signal voltage Vp under feedback control, the capacitance C can be measured.

According to the present embodiment, the probe signal Vp is a sinusoidal wave. This does not limit the present invention. Any waveform is adoptable. Even in such a case, a capacitance can be obtained from a magnitude of the probe signal voltage Vp needed to charge a predetermined capacitance.

The configuration of the electrode part of the probe and the voltage clamp control, equipotential driving control, and charge clamp control according to the present invention always drive the guard electrodes and all electrodes with a voltage equal to the probe signal Vp. During the voltage clamp operation, the potential of an electrode whose clamp current is being detected is fixed to the probe signal, and therefore, it is possible to highly stably and precisely measure a gap. A plurality of differential amplifiers INA may be arranged to simultaneously obtain clamp currents from a plurality of electrodes.

<Gap Measurement>

A gap measuring method employing the gap sensor according to the present invention will be explained.

Electrodes Ei of each pair in the electrode pair array 4 of the probe 2 are arranged on the top face P1 and bottom face P2, respectively, at the same position on the substrate 5 and are separately connected through the signal lines Es to the control unit 10 incorporated in the main body 21.

Figure 5:
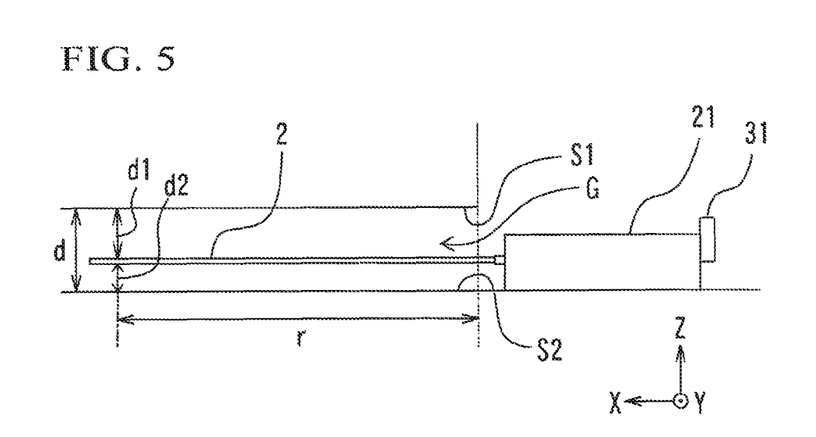
FIG. 5 is a schematic view illustrating a principle of gap measurement by the gap sensor.

As illustrated in FIG. 5, the probe 2 is inserted into the gap G and each electrode pair detects capacitances at the position, to obtain a capacitance between the upper electrode E1 and the surface S1, and then, a capacitance between the lower electrode E2, which is at the same position as the upper electrode E1, and the surface S2. Based on the capacitance data, a distance d1 between the upper electrode E1 and the surface S1 and a distance d2 between the lower electrode E2 and the surface S2 are obtained. It is then possible to find a gap d between the opposing surfaces S1 and S2. For each of the electrode pairs, a similar measurement is successively carried out to obtain a two-dimensional distribution of gaps d over the electrode part. The gap data obtained by the gap sensor 1 is transmitted through a communication unit 31 to a controller 30 that processes the data.

The electrode pairs 4 are discretely arranged on the probe 2. Since a plurality of electrode pairs are arranged, positions of the electrode pairs and gap data are usable to compute data relating to an optional position among adjacent electrode pairs. For example, gap data of adjacent three electrode pairs 4 may be complemented each other to obtain gap data of an optional position in an area surrounded by the electrode pairs in question. As a result, the embodiment reduces the size of the gap sensor and is able to continuously measure a wide gap space and three-dimensionally displaying the gap space. The probe 2 is provided with a scale 28 in the direction of the main axis Xc, and therefore, it is easy to confirm the position (depth) r of a measuring electrode Ei.

It is assumed that a measuring object whose gap is measured is made of conductive material such as aluminum alloy and carbon fiber. Even if it is made of nonconductive material, a gap measurement is possible if the surfaces thereof are coated or covered with conductive material.

Figure 6A:
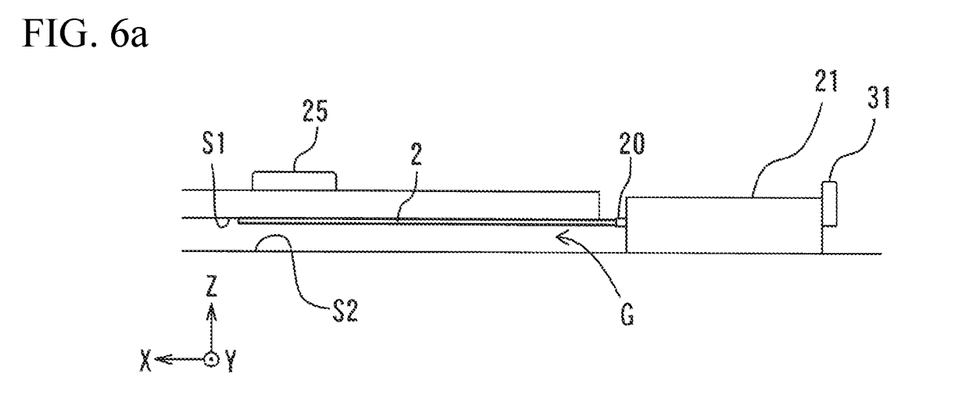
FIGS. 6(a) and 6(b) are schematic views illustrating gap measurement by the gap sensor.

When measuring gaps, it is preferable that electrode surfaces are in parallel with the measuring surfaces S1 and S2. As illustrated in FIG. 6(a), a magnet 25 may be used to attract the probe 2 to the measuring surface S1. The surface of the probe 2 is provided with a magnetic filler film, and therefore, arranging the magnet 25 to attract the probe 2 toward the measuring surface S1 realizes a more stable gap measurement.

The present invention employs the original electrode structure and measures capacitances with the use of the equipotential driving technique and charge clamp control, thereby improving the correctness and reproducibility of a measurement of gaps. The equipotential driving technique according to the present invention uses a probe signal as a common potential, and therefore, is effective not only to the three-layer substrate structure of the embodiment but also to any other structure involving a plurality of electrodes and guard patterns driven by a common potential.

When conducting a gap measurement, the gap sensor 1 must be calibrated. For the calibration, a reference sample made of aluminum flat plate and having predetermined gaps d0 is used. The predetermined gaps are, for example, 0.5 mm, 1 mm, 2 mm, and 3 mm. The metal flat plate and gap sensor 1 are commonly grounded. Into a gap G of the reference sample, the probe 2 is inserted to measure and correct the gaps d0. The correction includes correcting the above-mentioned reference amplitude A0 and the like.

Other Embodiments

Figure 6B:
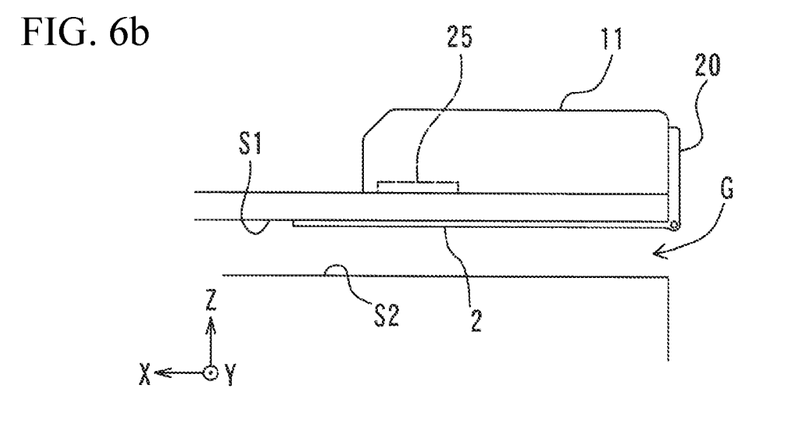
Figure 7:
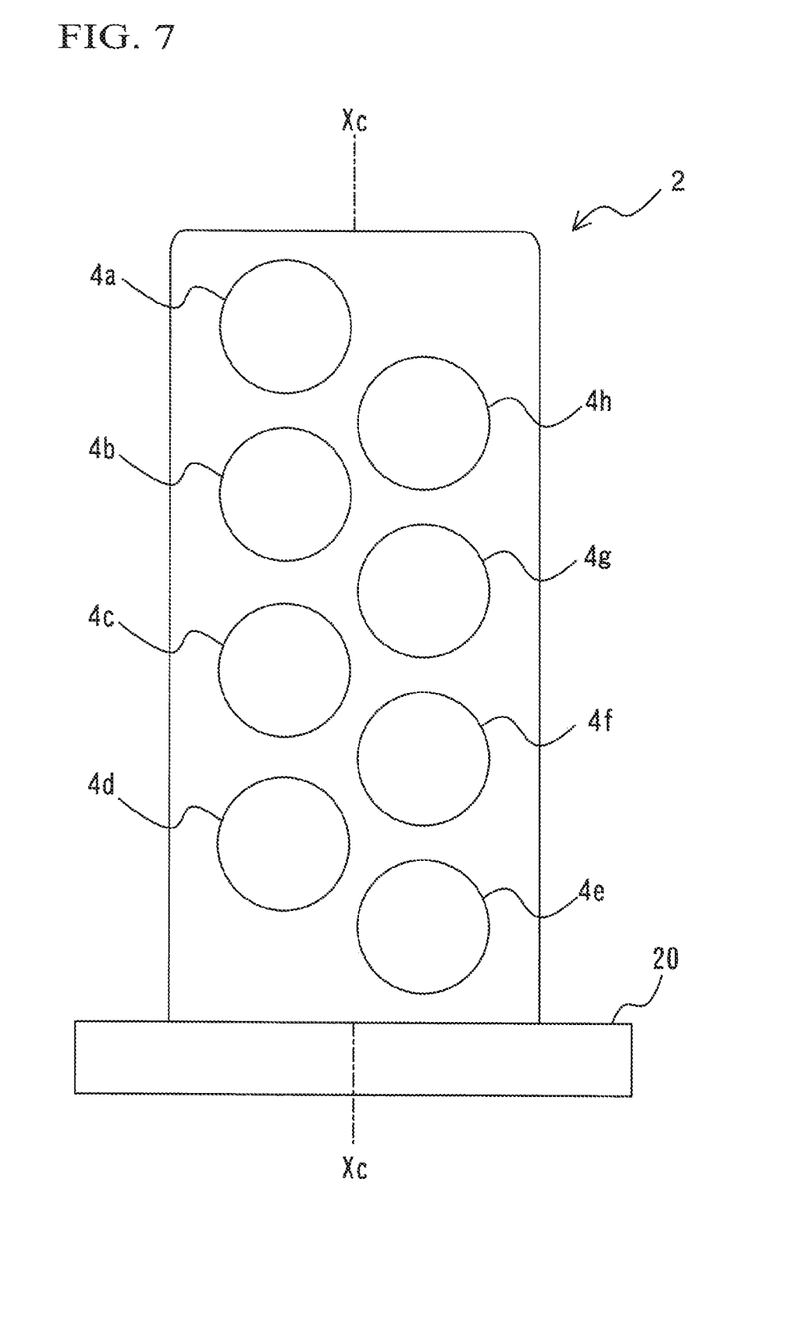
FIG. 7 is a schematic view illustrating electrodes of a probe according to another embodiment of the present invention.
Figure 8:
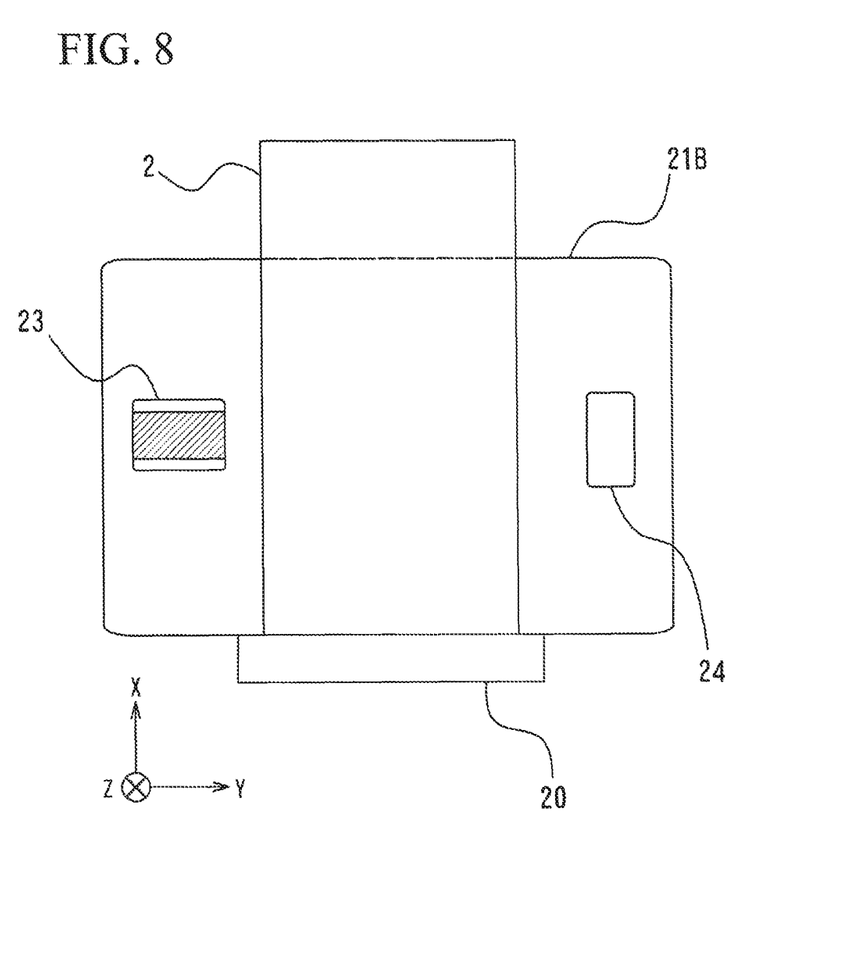
FIG. 8 is a bottom view illustrating a sensor main body according to the embodiment.

FIGS. 7 and 8 illustrate a probe 2 according to another embodiment. The structure of an electrode part thereof is the same as that of the probe 2 of the embodiment illustrated in FIG. 2. However, electrode pairs 4a to 4h are arranged along a main axis Xc of the probe 2 in two zigzag lines and include 16 circular electrodes. The probe 2 is fixed to a main body 21 through a probe support unit (including a connector) 20 that has a rotary shaft turnable around an axis Y. If an upper member such as a work is a plate member, the main body 21 is set on a top surface of the plate member and the probe 2 is folded toward a bottom face 21B and inserted into a gap G. The probe support unit 20 is vertically movable depending on the thickness of the plate member. As illustrated in FIG. 6(b), the bottom of the main body 21 incorporates a magnet 25 to attract the probe 2 to a surface S1 due to magnetism of a filler film of the probe 2.

A gap measurement is carried out as explained above by conducting the charge clamp control that applies a probe signal Vp to equalize a guard potential and the potential of every electrode and measures capacitances between upper and lower electrodes of each electrode pair 4 to obtain data about a gap d. The gap measurement is successively carried out on all of the electrode pairs 4.

Arranged on the bottom face 21B are a rotary encoder 23 serving as a position detecting sensor to measure a moving distance (a relative position) in the direction Y and a reference position detecting sensor 24 to confirm a reference position in the direction Y. Arranged at regular intervals in the direction Y on the top surface of the plate member are barcode markers that are detected by the reference position sensor 24. The reference position detecting sensor 24 reads reflected light from the markers and detects a reference position. According to this embodiment, the probe 2 is turned to be in parallel with the bottom face 21B of the main body 21. For a gap extending in, for example, a YZ-plane, the probe 2 may be turned to be in parallel with an axis Z to enable a gap measurement.

According to the present invention, the probe has a three-layer structure and the electrodes are provided with common guards, to realize a thin configuration to measure narrow gaps. The guards are set to a common potential to reduce the number of wires and increase the number of electrodes to be arranged on a probe. The equipotential driving control drives all electrodes and guards to an equal potential to realize a stable and reproducible measurement. The charge clamp technique enables a capacitance to be measured from the magnitude of a probe signal.

(United States Designation)

In connection with United States designation, this international patent application claims the benefit of priority under 35 U.S.C. 119(a) to Japanese Patent Application No. 2017-104083 filed on May 26, 2017 whose disclosed contents are incorporated herein by reference.

The invention claimed is:

1. A gap sensor for detecting gaps between a surface of a conductive first member and a surface of a conductive second member facing the first member by use of a capacitance measuring technique, the gap sensor comprising:
   a) a probe extending in a direction of a main axis and having
      i) a base end part connected to a main body,
      ii) a front end side provided with a plurality of electrodes,
      iii) first and second faces, and
      iv) a multilayer substrate structure including a first conductive layer, a second conductive layer, and a third conductive layer laminated one on another,
      the first conductive layer defining the first face of the probe and providing
         an arrayed first electrode group and a first guard layer electrically disconnected from the first electrode group,
      the third conductive layer defining the second face of the probe and providing
         an arrayed second electrode group at a position corresponding to the first electrode group and a second guard layer electrically disconnected from the second electrode group,
      the second conductive layer being arranged between the first conductive layer and the third conductive layer and providing
         a guard electrode at a position corresponding to the first and second electrode groups, and
         signal patterns electrically disconnected from the guard electrode, and electrically connected to electrodes of the first and second electrode groups, respectively; and
   b) the main body supporting the probe and having a control circuit applying a probe signal to the first guard layer, to the guard electrode, and to the second guard layer, voltage clamping the electrodes of the first and second electrode groups through the signal patterns according to the probe signal, and detecting clamp currents due to the voltage clamp, thereby measuring gaps at the positions of the electrodes.

2. The gap sensor according to claim 1, wherein the control circuit includes:
   a probe signal generator;
   a drive circuit that applies a voltage of the probe signal to the first guard layer, to the guard electrode, and to the second guard layer;
   a voltage clamp circuit that separately drives the electrodes of the first and second electrode groups and clamps the electrodes to the voltage of the probe signal; and
   a current detecting circuit that detects clamp currents of the electrodes,
   the detected currents being used to compute capacitances and measure gaps.

3. The gap sensor according to claim 2, wherein:
   the voltage clamp circuit includes:
      a clamp amplifier that performs the voltage clamp control according to the probe signal and a clamp current detecting resistor connected between a driving output and a negative feedback input of the clamp amplifier, an end of the clamp current detecting resistor on the negative feedback input side being connected to a corresponding electrode; and
      a reference clamp amplifier that is not connected to the corresponding electrode performs the voltage clamp control according to the probe signal and a reference current detecting resistor connected between a driving output and a negative feedback input of the reference clamp amplifier; and
   the current detecting circuit includes a differential amplifier that computes a difference between the driving output of the clamp amplifier and the driving output of the reference clamp amplifier.

4. The gap sensor according to claim 3, wherein the clamp amplifier and the reference clamp amplifier related to each electrode of the first and second electrode groups are contained in one package.

5. The gap sensor according to claim 1, wherein:
   a voltage clamp circuit feeds back an error between the probe signal and the voltage of each electrode, thereby clamp-controlling the electrode; and
   a clamp current detecting resistor connected between a driving output of the voltage clamp circuit and each electrode supplies a current detected as a clamp current.

6. The gap sensor according to claim 1, further comprising a microcontroller that increases an amplitude of the probe signal when an amplitude of the clamp current decreases and decreases the amplitude of the probe signal when the amplitude of the clamp current increases so as to keep the magnitude of a detected clamp current constant and that computes a capacitance according to the magnitude of the probe signal.

7. A gap measuring method of measuring, by use of a capacitance measuring technique, gaps between a surface of a conductive first member and a surface of a conductive second member that faces the first member with the use of a probe the method comprising:

a) generating a probe signal with a control circuit of a gap sensor including the probe;
b) applying the probe signal to
　i) a first guard layer of a first conductive layer of a multilayer substrate structure of the probe that defines a first face of the probe, the first guard layer being electrically disconnected from an arrayed first electrode group of the first conductive layer,
　ii) a guard electrode of a second conductive layer of the multilayer substrate structure of the probe arranged between the first conductive layer and a third conductive layer of the multilayer substrate structure of the probe, at a position corresponding to the arrayed first electrode group and corresponding to an arrayed second electrode group of the third conductive layer at a position corresponding to the arrayed first electrode group, and
　iii) a second guard layer of the third conductive layer electrically disconnected from the arrayed second electrode group;
c) separately voltage clamping, with the control circuit, according to the probe signal, the electrodes of the arrayed first and second electrode groups of the probe through signal patterns of the second conductive layer electrically disconnected from the guard electrode;
d) measuring, with the control circuit, clamp currents of the electrodes of the arrayed first and second electrode groups of the probe due to the voltage clamping, thereby measuring capacitances at respective positions of the electrodes of the arrayed first and second electrode groups of the probe; and
e) according to the capacitances, measuring gaps at the respective electrode positions of the electrodes of the arrayed first and second electrode groups of the probe.

8. The gap measuring method according to claim 7, wherein the probe signal is a sinusoidal wave whose amplitude is varied according to the magnitude of the clamp current.

9. The gap measuring method according to claim 8, wherein a gap at an intermediate position among the electrodes is obtained in accordance with gap distances and electrode-to-electrode distances of adjacent ones of the electrode pairs.

10. The gap measuring method according to claim 7, wherein the amplitude of the probe signal is feedback controlled so as to keep the magnitude of the clamp current constant and determining a capacitance according to an amplitude of the feedback-controlled probe signal.

11. A gap measuring method of measuring, gaps between a surface of a conductive first member and a surface of a conductive second member that faces the first member with the use of a probe, the method comprising:
a) providing a gap sensor including
　aa) the probe extending in a direction of a main axis and having
　　i) a main body,
　　ii) a plurality of electrodes,
　　iii) first and second faces, and
　　iv) a multilayer substrate structure including a first conductive layer, a second conductive layer, and a third conductive layer laminated one on another,
　the first conductive layer defining the first face of the probe and providing a first electrode group and a first guard layer electrically disconnected from the first electrode group,
　the third conductive layer defining the second face of the probe and providing a second electrode group at a position corresponding to the first electrode group and a second guard layer electrically disconnected from the second electrode group,
　the second conductive layer being arranged between the first conductive layer and the third conductive layer and providing
　　a guard electrode at a position corresponding to the first and second electrode groups, and
　　signal patterns electrically disconnected from the guard electrode, and electrically connected to electrodes of the first and second electrode groups, respectively, and
　bb) a control circuit configured to apply a probe signal to the first guard layer, the guard electrode, and the second guard layer, to voltage clamp the electrodes of the first and second electrode groups through the signal patterns according to the probe signal, and to detect clamp currents due to the voltage clamp, thereby measuring gaps at the positions of the electrodes;
b) generating a probe signal with the control circuit;
c) applying the probe signal to the first guard layer, the guard electrode, and the second guard layer with the control circuit;
d) separately voltage clamping the electrodes of first and second electrode groups of the probe through the signal patterns of the probe according to the probe signal;
e) measuring clamp currents of the electrodes of the first and second electrode groups of the probe based on the voltage clamping, thereby measuring capacitances at respective positions of the electrodes of the first and second electrode groups of the probe; and
f) according to the capacitances, measuring gaps at the respective electrode positions of the electrodes of the first and second electrode groups of the probe.

12. The gap measuring method according to claim 11, wherein the probe signal is a sinusoidal wave with an amplitude that is varied in accordance with the magnitude of the clamp current.

13. The gap measuring method according to claim 12, wherein a gap at an intermediate position among the electrodes is obtained in accordance with the gap distances and electrode to electrode distances of adjacent ones of the electrode pairs.

14. The gap measuring method according to claim 11, wherein the amplitude of the probe signal is feedback controlled so as to maintain the magnitude of the clamp current constant and determining a capacitance according to an amplitude of the feedback-controlled probe signal.

* * * * *